Jan. 20, 1970 R. G. FRIESER ET AL 3,490,961
METHOD OF PRODUCING SILICON BODY
Filed Dec. 21, 1966
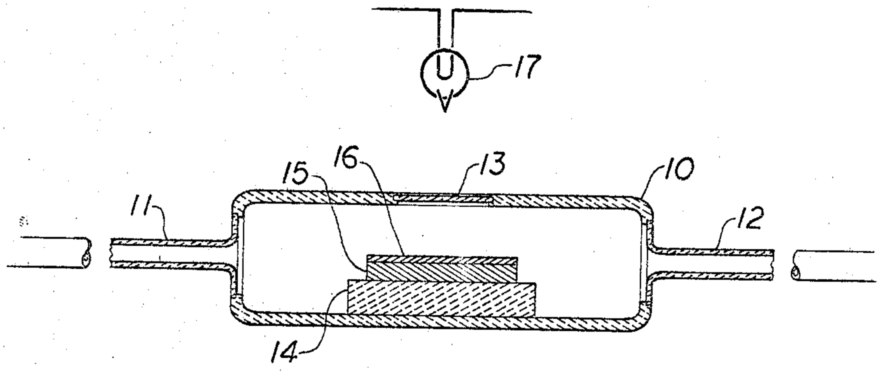

United States Patent Office 3,490,961

Patented Jan. 20, 1970

3,490,961
METHOD OF PRODUCING SILICON BODY

Rudolf G. Frieser and James J. Casey, Williamstown, Mass., assignors to Sprague Electric Company, North Adams, Mass., a corporation of Massachusetts Filed Dec. 21, 1966, Ser. No. 603,534
Int. Cl. H01l 7/36
U.S. Cl. 148—175 8 Claims

ABSTRACT OF THE DISCLOSURE

A method of depositing an epitaxial layer of single crystal silicon on a silicon substrate by establishing an atmosphere containing a reducible and/or pyrolyzable silicon compound represented by the formula $Si_nX_{2n}+_2$ wherein X are halogen atoms, hydrogen atoms or any combination thereof and *n* has a value of 2 or more. Directing electromagnetic radiation through said atmosphere onto the surface of said substrate to effect epitaxial deposition of silicon thereon.

BACKGROUND OF THE INVENTION

This invention relates to a process for a low temperature single crystal silicon epitaxial growth on a single crystal silicon substrate by chemical vapor deposition methods. It does not relate to epitaxial growth by vacuum evaporation or sputtering methods, which have not yet been controllably developed.

The deposition of single crystal, silicon epitaxial films on single crystal silicon substrates is a process which has gained great importance in recent years in the development and manipulation of silicon diodes, transistors, and microcircuits. As the importance of this process has grown, it has been applied to silicon substrate bodies of complicated structures, i.e., containing one or more p-n junctions or regions isolated from each other by insulating barriers. Because of deleterious effects produced in such structures, and even in simple structures, by prior art methods, it is of great importance to develop a process, such as the one described herein, for the elimination of the disadvantages of the prior art methods.

Some of the disadvantages of the prior art methods are as follows: Obviously they are more expensive since high temperatures, e.g. greater than 1000° C., are employed. The high temperature causes diffusion of unwanted impurities into the silicon during the process. In the case of a simple substrate, these impurities will diffuse into the epitaxial growth from the substrate, eliminating the highly desirable possibility of obtaining a step junction at the juncture between the silicon substrate and the epitaxially grown layer. In the case of complex substrates, into which may be incorporated precisely placed p-n junctions, or buried layers, the high temperatures have the disadvantage of moving the junctions from their precisely placed positions, thus destroying the desired geometrical juxtaposition of the conductivity regions in the substrate. Another disadvantage on the prior art methods is that the silicon precursors used contain only one atom of silicon per molecule of precursor, so that the formation of a critical nucleus for epitaxial growth on the substrate surface must rely on high temperature to obtain the necessary mobility for individual atoms to form clusters of two or more atoms of which the critical nuclei consist.

In one specific prior art process a crystalline substrate has an epitaxial layer grown thereon by establishing an appropriate atmosphere adjacent the substrate, heating the system to just below that which is sufficient to effect the growth process and supplying the remaining energy by electromagnetic radiation to a confined area where growth is desired. This process contemplates the formation of silicon epitaxial layers, but it does not teach what particular silicon precursors should or can be employed. It has been determined that this prior art process will not produce oriented epitaxial layers at comparatively low temperatures, e.g. below 800° C., when the silicon precursor has a single silicon atom.

SUMMARY OF THE INVENTION

This invention relates to an improved method of vapor depositing a silicon epitaxial layer on a silicon substrate by (a) establishing, adjacent a silicon substrate, a vapor atmosphere selected from the group consisting of (1) hydrogen gas with a reducible and/or pyrolyzable silicon compound of the formula $Si_nX_{2n}+_2$ wherein X are halogen atoms, hydrogen atoms or any combination thereof and wherein *n* has a value of 2 or more and (2) an inert carrier gas with a pyrolyzable compound of the formula $Si_nH_{2n}+_2$ wherein *n* has a value of 2 or more;

(b) maintaining the temperature of the atmosphere between about 600–800° C. and the pressure at about one atmosphere; and (c) directing electromagnetic radiation through said vapor at said substrate to effect epitaxial deposition of oriented silicon on said silicon substrate.

For most practical purposes, the value of *n* in the above general formula will be either 2 or 3. By this invention the epitaxial growth takes place at considerably lower temperatures than ever before obtained. At the lower temperatures there is a minimum of junction migration between the two layers. Also, at the lower temperatures, lower melting contact metals can be employed. The hydrogen or inert carrier gas is present in a sufficient amount to insure the controlled decomposition of the silicon precursor in such a way that groups consisting of at least two silicon atoms are deposited on the surface of the substrate silicon.

It is an object of the invention to present a process for forming single crystal epitaxial silicon which allows the formation of a step junction at the juncture of the substrate and the epitaxially grown layer.

It is a further object of the invention to present a method for epitaxial growth of single crystal silicon which will allow the preservation of precise geometrical juxtaposition of p-n junctions and buried layers in the substrate silicon.

BRIEF DESCRIPTION OF THE DRAWING

The drawing is a cross-sectional view of the apparatus employed in carrying out the process of the invention.

The drawing shows a furnace 10 having an inlet line 11 and an outlet line 12. The furnace is equipped with a window 13 and a support member 14. Positioned on the support member is a single crystal slice of silicon 15. Formed as an extension of 15 is epitaxial layer 16. Located outside of furnace 10 is electromagnetic radiation source 17 adapted to radiate through window 13 in the direction of silicon slice 15.

DETAILED DESCRIPTION OF THE INVENTION

Example

Furnace 10 of the drawing is purged with hydrogen gas supplied through inlet 11 from a source not shown. Waste gas is eliminated via outlet 12. The furnace, with silicon slice 15 therein, is heated to a temperature of about 700° C. Thereafter, a mixture of hydrogen and disiliconhexachloride is introduced into the furnace chamber. Ultraviolet light from source 17 is directed through window 13 and through the gas mixture at the silicon slice. The process is carried out as an open flow system, i.e. pressure about one atmosphere. After a period of about one hour, an epitaxial growth of one micron thick of oriented silicon was formed on the silicon substrate.

The quality of the epitaxial silicon was excellent. The film was obtained at a temperature lower than ever before obtained in a chemical vapor deposition process operated at about one atmosphere.

By way of comparison, under exactly the same conditions, $SiCl_4$, $SiCl_3H$ and $SiH_4$ resulted in either no deposit or only a polycrystalline deposit.

Repeating the process of the example without the use of ultraviolet light, no film was obtained until the temperature was increased to about 1200° C. When disilane, $Si_2H_6$, was substituted for disiliconhexachloride in the process, an epitaxial layer of silicon having a high degree of crystalline orientation was formed.

It is to be understood that by the term "pyrolyzable compound" this refers to the instance where the silicon precursor has the general formula $Si_nH_{2n+2}$. Thus, the condition existing in the vapor atmosphere is one of dilution and not of reduction when no halogen is present in the precursor. Moreover, while hydrogen has been stated as the appropriate atmosphere for most circumstances, other atmospheric conditions can be employed to advantage with certain precursors. For example, when the precursor is a silicon hydride, $Si_nH_{2n+2}$, of the type contemplated herein, the atmosphere can be any inert carrier atmosphere. Argon is a specific atmosphere which would be appropriate.

The term "halogens" is used with its conventional meaning. The silicon precursor can contain all the same or different halogen atoms or both hydrogen atoms and halogen atoms.

It is also to be understood that the temperature can be varied from 600–800° C. depending upon the character and quality of the silicon film desired. The electromagnetic radiation preferably predominates in ultraviolet light.

Since it is obvious that many changes and modifications can be made in the above-described details without departing from the nature and spirit of the invention it is to be understood that the invention is not limited to said details except as set forth in the appended claims.

What is claimed is:

1. A method of vapor depositing a silicon epitaxial layer on a semiconductive substrate comprising:

(a) establishing, adjacent a semiconductive substrate, a vapor atmosphere selected from the group consisting of (1) a mixture selected from the group consisting of (1*a*) hydrogen gas with a reducible silicon compound of the general formula $Si_nX_{2n+2}$ wherein X are halogen atoms, hydrogen atoms or any combination thereof and wherein *n* has a value of 2 or more, (1*b*) hydrogen gas with a pyrolyzable silicon compound of the same general formula as said reducible compound and (1*c*) hydrogen gas with a reducible and pyrolyzable silicon compound of the same general formula as said reducible compound, and (2) an inert carrier gas with a pyrolyzable compound of the formula $Si_nH_{2n+2}$ wherein *n* has a value of 2 or more;

(b) maintaining the temperature of the atmosphere between about 600–800° C. and the pressure at about one atmosphere; and (c) directing electromagnetic radiation through said vapor at said substrate to effect epitaxial deposition of oriented silicon on said substrate.

2. The method of claim 1 wherein *n* has a value of 2 or 3.

3. The method of claim 2 wherein the vapor atmosphere is hydrogen gas with said reducible and pyrolyzable compound.

4. The method of claim 2 wherein the vapor atmosphere is an inert carrier gas with said pyrolyzable compound.

5. The method of claim 2 wherein the reducible compound is disiliconhexachloride.

6. The method of claim 2 wherein the pyrolyzable compound is silicon hydride, $Si_2H_6$.

7. The method of claim 2 wherein the vapor atmosphere is hydrogen gas with said reducible compound.

8. The method of claim 2 wherein the vapor atmosphere is hydrogen gas with said pyrolyzable compound.

References Cited

UNITED STATES PATENTS 3,200,018 8/1965 Grossman ---------- 148—175

HOWARD S. WILLIAMS, Primary Examiner

U.S. Cl. X.R.

117—93.3, 106; 148—1.5; 204—157.1

FO-1050
(5/69)

UNITED STATES PATENT OFFICE

CERTIFICATE OF CORRECTION

Patent No. 3,490,961 Dated January 20, 1970

Inventor(s) Rudolf G. Frieser et al

It is certified that error appears in the above-identified patent and that said Letters Patent are hereby corrected as shown below:

Add the following claim:

-- 9. The method of claim 1 wherein said semiconductive substrate is silicon. --

In the heading to the printed specification, line 8, "8 Claims" should read -- 9 Claims --.

SIGNED AND
SEALED
SEP 1 - 1970

(SEAL)
Attest:

Edward M. Fletcher, Jr.
Attesting Officer

WILLIAM E. SCHUYLER, JR.
Commissioner of Patents